United States Patent [19]

Scott et al.

[11] Patent Number: 4,797,374

[45] Date of Patent: Jan. 10, 1989

[54] METHOD FOR SELECTIVE HETEROEPITAXIAL III-V COMPOUND GROWTH

[75] Inventors: Michael D. Scott, Northampton, Great Britain; Alan H. Moore, Quebec, Canada

[73] Assignee: Plessey Overseas Limited, Ilford, England

[21] Appl. No.: 34,178

[22] PCT Filed: Jul. 18, 1986

[86] PCT No.: PCT/GB86/00423

§ 371 Date: May 20, 1987

§ 102(e) Date: May 20, 1987

[87] PCT Pub. No.: WO87/00694

PCT Pub. Date: Jan. 29, 1987

[30] Foreign Application Priority Data

Jul. 20, 1985 [GB] United Kingdom ............... 8518353

[51] Int. Cl.[4] .................. H01L 21/20; H01L 21/76
[52] U.S. Cl. ........................ 437/129; 148/DIG. 29; 148/DIG. 65; 148/DIG. 72; 148/DIG. 119; 156/692; 437/133; 437/905; 437/970; 357/16
[58] Field of Search ............. 148/DIG. 29, 65, 72, 148/95, 101, 110, 119, 169; 156/610-614; 118/723, 722, 719, 733, 50.1, 620; 357/16, 17, 60; 437/81, 104, 107, 112, 126, 129, 133, 904, 905, 970

[56] References Cited

U.S. PATENT DOCUMENTS

| | | | |
|---|---|---|---|
| 3,425,879 | 2/1969 | Shaw et al. | 437/90 |
| 3,586,925 | 6/1971 | Collard | 437/93 |
| 4,066,482 | 1/1978 | Shaw | 156/612 |
| 4,077,817 | 3/1978 | Bellavance | 437/129 |
| 4,084,130 | 4/1978 | Holton | 372/50 |
| 4,114,257 | 9/1978 | Bellavance | 437/133 |
| 4,178,197 | 12/1979 | Marinace | 437/93 |
| 4,467,521 | 8/1984 | Spooner et al. | 437/90 |

OTHER PUBLICATIONS

Oron et al., "Lasing Properties of InGaAsP Buried Heterojunction Lasers Grown on a Mesa Substrate", Appl. Phys. Lett., 41(7), Oct. 1982, pp. 609-611.

Kishino et al., "Fabrication . . . of Mesa Substrate Buried Heterostructure GaInAsP/InP Lasers . . . ," IEEE J. of Quantum Electronics, vol. QE-16, No. 2 Feb. 1980 pp. 160-164.

Sugimoto et al., "InGaAsP/InP Current Confinement Mesa Substrate Buried Heterostructure Laser Diode . . . ," IEEE J. Lightwave Tech. vol. LT-2, No. 4 Aug. 1984 pp. 496-503.

Ishikawa et al., "V-Grooved Substrate Buried Heterostructure InGaAsP/InP Laser", Electronics Letters, vol. 17, No. 13, Jun. 25, 1981, pp. 465-467.

Tamari et al., ". . . Crescent InGaAsP Mesa-Substrate Buried-Heterojunction Lasers", Electronics Letters, vol. 18, No. 4 Feb. 18, 1982 pp. 177-178.

Primary Examiner—Brian E. Hearn
Assistant Examiner—William Bunch
Attorney, Agent, or Firm—Michael F. Oglo; Julian C. Renfro

[57] ABSTRACT

A method of producing a heterostructure device comprises defining in a substrate 5 of group III-V semiconductor material a structure, such as a mesa 9, having first and second faces oriented substantially parallel to the (100) and (111)A crystallographic planes. The mesa 9 is exposed to group III-V chemical reagents thereby to deposit group III-V materials on the first and/or second faces in dependence upon the group V constituent in the chemical reagents.

13 Claims, 2 Drawing Sheets

METHOD FOR SELECTIVE HETEROEPITAXIAL III-V COMPOUND GROWTH

TECHNICAL FIELD

The present invention concerns improvements in or relating to methods for producing a heterostructure electronic and optoelectronic devices in particular a device based upon indium phosphide substrate material.

Such devices as aforesaid include buried double heterostructure lasers, multiple quantum well lasers, heterojunction light emitting diodes and waveguide structures.

BACKGROUND ART

Hitherto, heterostructure devices have been produced by liquid phase epitaxy (LPE) and by metal-organic chemical vapour deposition (MOCVD) growth techniques. It has been conventional practice to produce these devices by defining structure in preformed multi-layer structures.

Typical processes as aforesaid comprise:

(i) LPE or MOCVD growth of a multi-layered structure; followed by, (ii) Etch-resistant mask definition;

(iii) Etch-definition of device structure;

(iv) Staining to under cut active layer to reduce stripe width;

(v) Infilling with semi-insulating or p-type doped material; and, (vi) Contact metallisation.

Process schedules for the above typically employ a large number of photolithographic mask definition stages and material selective etch process sequences. Furthermore, complex and expensive lithographic techniques are required for definition of sub-micron dimension structures.

DISCLOSURE OF THE INVENTION

The present invention is intended as a simple alternative technique to the foregoing.

It has now been discovered that the metal-organic chemical vapour deposition of group III-V materials is sensitive to the crystallographic orientation of the substrate material and the group V composition in the group III-V material. For example, it has been determined that selective deposition of such materials may be achieved by the use of arsenides, such as gallium indium arsenide or aluminium indium arsenide, whilst conformal deposition of these materials may be achieved by the use of phosphides, such as indium phosphide. It is thus now possible to define processing schedules that take advantage of orientation selective deposition.

The term III-V will not be described herein as it is considered to be a term understood by those skilled in the art.

In accordance with the present invention there is thus provided a method for producing a heterostructure semiconductor device, the method comprising defining a structure in a semiconductor substrate comprising a group III-V material, the structure comprising one or more first faces orientated parallel or near parallel to a first crystallographic plane and one or more second faces parallel or near parallel to a second crystallographic plane, and exposing the structure to a group III vapour phase chemical reagent group III or a group V chemical reagent or any admixture thereof, thereby to deposit a group III-V material on a first and/or a second face in dependence upon the group V constituent in the vapour phase chemical reagent or reagents.

The vapour-phase chemical reagents aforesaid may comprise either a mixture of metal-organic reagent species, or a mixture of metal-organic and hydride or halide reagent species.

The first faces may be oriented parallel or near parallel to the (100) crystallographic plane, and the adjacent second faces may be oriented parallel or near parallel to (111) A planes, to form mesa or trough structures. (The (111) A planes, referred to here, are group III atomic planes). It is often preferable to orientate said first faces at a slight offset of up to 5°, preferably 2°, relative to the (100) crystallographic plane, to provide a better key for deposition.

The aforesaid structure may be defined using an edge-aligned mask structure and an anisotropic etchant. For example, this may be performed using one or more oxide stripes aligned with edges extending in the (011) or (01$\bar{1}$) directions and a bromine based etchant, eg. an anisotropic etchant appropriate to the material being etched e.g. Bromine/Methonol (1%) solution, to reveal the (111) A plane faces in Indium Phosphide. Typically the mask stripes may be of between 3 and 6 microns in width and the mesas/troughs of between 2 and 3 microns in depth. At greater dimensions than these, the efficacy of this technique may depend upon size effects. However, the techinique has successfully been demonstrated using mesa/troughs of up to 100 $\mu$m wide in recent studies.

BRIEF INTRODUCTION OF THE DRAWINGS

In the drawings accompanying this specification:

DESCRIPTION OF THE EMBODIMENTS

Figure 1:
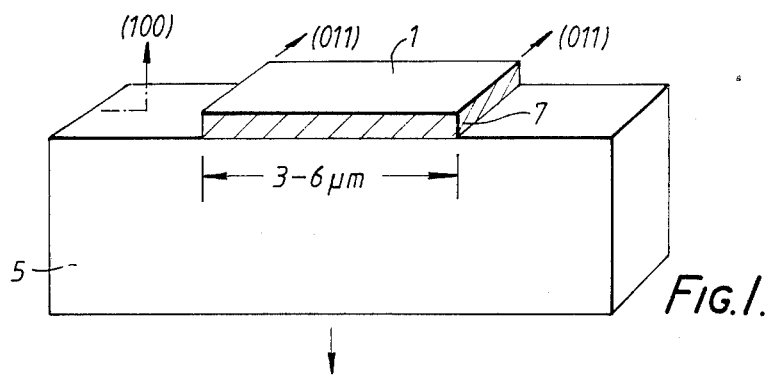
FIGS. 1 to 5 are sectioned perspective views of a semiconductor structure, illustrating the sequential stages of a method, performed in accordance with this invention, to produce a buried layer heterostructure device.
Figure 2:
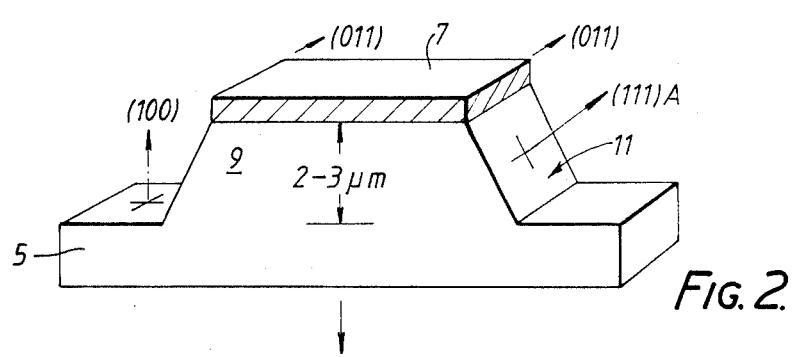

Embodiments of the invention will now be described, by way of example only, with reference to the accompanying drawings.

In the first stage of the process illustrated in FIGS. 1 to 5, an etch-resistant oxide stripe 1 is defined on the (100) plane surface 3 of a cleaned single crystal indium phosphide material substrate wafer 5. The stripe 1 has been defined to have its long edges 7 aligned with the (01$\bar{1}$) crystallographic direction and is typically of between 3 and 6 microns in width. (See FIG. 1).

In the next stage of this process (FIG. 2) the striped substrate 5 is immersed in a bath containing bromine/methanol (1%) solution anisotropic etchant until a mesa 9 of between 2 and 3 microns depth is produced, exposing mesa side faces 11 oriented parallel to the (111)A planes.

Figure 3:
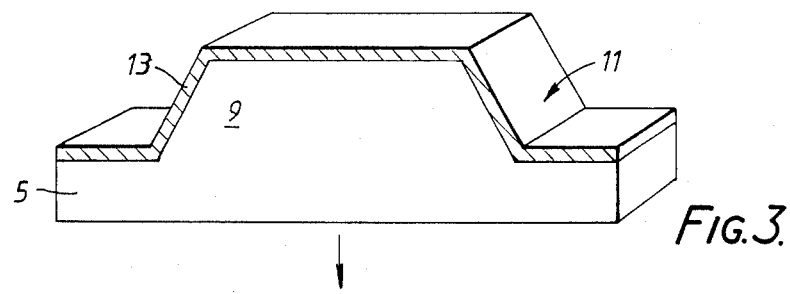

The oxide stripe 1 is then removed, and after cleaning, the substrate 5 is placed in a reaction vessel and exposed to metal-organic chemical vapour reagents. An epitaxial layer 13 of indium phosphide (doped) is thus grown on the exposed surfaces 3,11 of the substrate 5. Typically, growth is continued until this layer is 0.5 microns thick (FIG. 3). It is noted that this stage of growth is conformal (non-selective), deposits being formed on all exposed surfaces.

Conditions for Indium phosphide growth may be as described in "The Characterisation of $Ga_{1-2}In_xAs$, $Al_{1-x}In_xAs$ and InP Epitaxial Layers Prepared by Metal-Organic Chemical Vapour Deposition,"by M. D. Scott et al, in the Journal of Crystal Growth 68 (1984) pages 319-325, North Holland, Amsterdam, the contents of which are specifically included herein by reference.

An example of Indium phosphide growth conditions is given in Table I below, using the reagents trimethyl indium (TMI) and phosphine ($PH_3$):

TABLE I

| | |
|---|---|
| Rectangular cross-section reactor area: | 4 cm$^2$. |
| Growth temperature: | 600° C. |
| Growth rate (InP): | 0.03 μm/min. |
| TMI concentration: | $4 \times 0 \times 10^{-5}$ MF |
| $PH_3$ concentration: | $3.7 \times 10^{-3}$ MF |
| Total flow-rate: | 4.0 l/min. |

Following this latter stage of the process, the reagents are then changed and gallium indium arsenide alloy growth commenced. Again this growth is under conventional conditions which may be as described in the above article:

TABLE II

| Conditions of Gallium Indium Arsenide growth from trimethyl gallium, trimethyl indium (TMI) and arsine ($A_sH_3$) vapour phase reagent:- | |
|---|---|
| Rectangular cross-section reactor acea:- | 4 cm$^2$. |
| Growth temperature:- | 600° C. |
| Growth rate:- | 0.06 μm/min. |
| TMI concentration:- | $4.0 \times 10^{-5}$ MF |
| TMG concentration:- | $2.3 \times 10^{-5}$ MF |
| $A_sH_3$ concentration:- | $3.7 \times 10^{-3}$ MF. |
| Total flow-rate:- | 4.4 l/min. |

Figure 4:
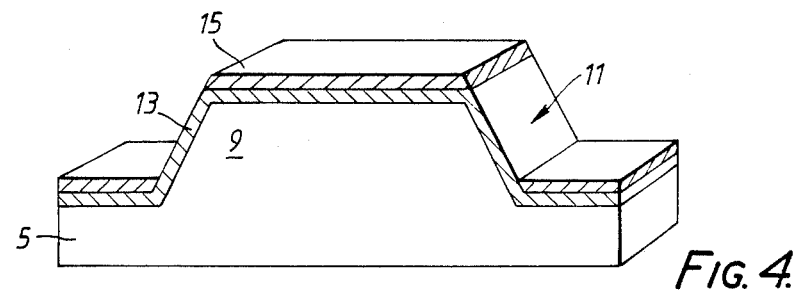

As shown in FIG. 4, this stage of the growth is selective, ie. orientation dependant. Gallium Indium Arsenide is readily deposited on the (100) faces but not upon the mesa side (111)A faces. Growth is continued until epitaxial layers 15, having a thickness of ~0.5 micron, are grown.

Figure 5:
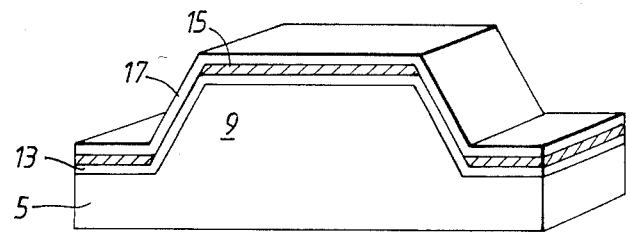

At the conclusion of the above growth phase, the reagents are again changed and an indium phosphide conformal layer 17 grown (FIG. 5). This last growth phase is nonselective and a buried heterostructure results. Electrodes may then be formed by conventional metallisation.

Alternative structures that can be accessed by variants of the method, just described, are shown in the remaining figures.

Figure 7:
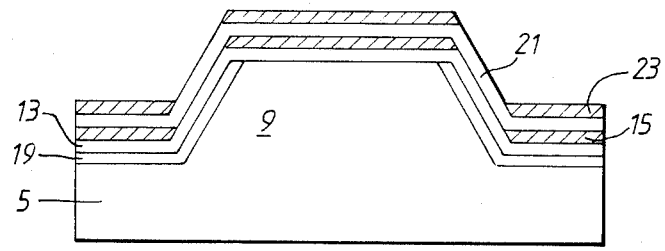

A double heterostructure laser is shown in FIG. 7. This comprises an n-type indium phosphide mesa'd structure 5,9 into which dopant has been diffused to define a p-type diffusion layer 19. The mesa 9 and substrate 5 have been covered by an epitaxial layer 13 of n-type indium phosphide and on this layers 15 of gallium indium arsenide ternary alloy or gallium aluminium indium arsenide have been selectively deposited. These in turn have been covered by an epitaxial layer 21 of p-type indium phosphide and selectively grown p-type enriched layers 23 of gallium indium arsenide.

Figure 8:
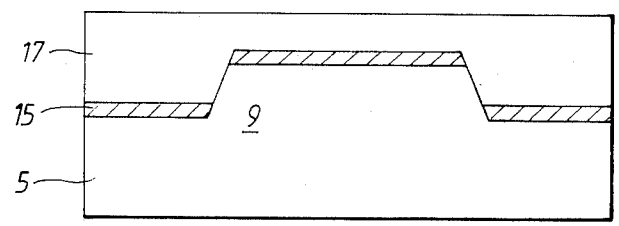

An optical waveguide structure is shown in FIG. 8. This comprises an indium phosphide mesa'd structure 5,9 on which guide stripe layers 15 of gallium indium aluminium arsenide have been grown selectively. The whole has been covered and infilled by a layer 17 of indium phosphide.

From the foregoing description, it will be realised by those skilled in the art that, by adopting the method of the present invention, the laser and/or waveguide structures may be fabricated using fewer process steps than known techniques for producing these devices. Furthermore, device yield is substantially improved as the impurities introduced by the many etch steps of known methods, which can lead to device failure or malfunction, are not present using the crystallographic selective deposition technique of the present invention.

The method of this invention is not restricted to the growth of the structures above described, and other structures taking advantage of this selective deposition, orientation dependant, technique will be apparent to those skilled in the art. For example, although the present invention has been described with particular reference to indium phosphide based III-V materials, it will be realised that crystallographic selective epitaxial growth may be realised with Gallium Arsenide based materials.

Figure 6:
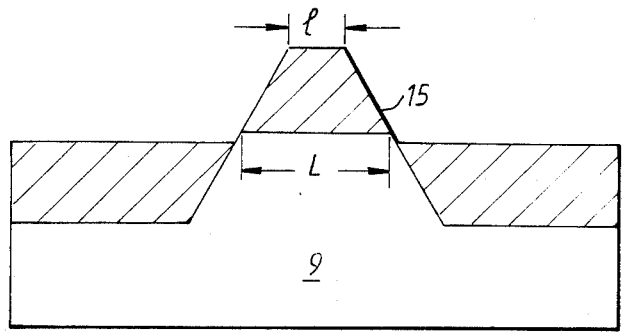
FIGS. 6, 7 and 8 are illustrative cross-sectioned views of a semiconductor structure, a buried double heterostructure laser and of an optical waveguide structure, respectively, similarly produced by applying the method aforesaid.

In addition to the ability to prepare buried stripes of uniform and precise thickness this process also offers the ability to tailor the lengths of epitaxial layers at sub-micron dimensions without having to resort to complex and expensive lithographic techniques. This may be achieved by growing on substrates which have been contoured with relatively large scale dimensions and then allowing selective growth, of for example, gallium indium arsenide, so as to reduce the dimensions of the contours to the required sub-micron level. An example of the structure obtained by a continuation of selective growth is shown in FIG. 6, where it can be seen that the length of the surface of the layer 15 is substantially less than the length L of the (100) face of the mesa 9.

Beyond the immediate application of this selective area deposition to the simplified preparation of buried double heterostructure lasers, based on the example structure shown in FIG. 7, this technique may be used in the preparation of multiple quantum well GaInAs-/AlInAs laser structures in which the multi-quantum well replaces the single layer active region of FIG. 7 and in the preparation and integration of small area detectors. It may also be relevant for use in waveguide structures (see FIG. 8) prepared by hybrid MOCVD/-trichloride growth techniques.

We claim:

1. A method for producing a heterostructure semiconductor device, the method comprising defining a structure in a semiconductor substrate comprising Indium Phosphide, the structure comprising one or more first faces orientated parallel or near parallel to a first crystallographic plane andd one or more second faces parallel or near parallel to a second crystallographic plane, and exposing the structure to a group III vapour phase chemical reagent and a group V chemical reagent, thereby to deposit a first group III-V material on said first or said second faces using one group V constituent without the use of a mask and deposit a second group III-V material on both said first and said second faces using another group V constituent.

2. A method according to claim 1 wherein the group V constituent comprises phosphorus thereby to deposit the group III-V material on first and second faces of the defined structure.

3. A method according to claim 1 wherein the group V constituent comprises arsenic thereby to deposit the group III–V material on a first face of the defined structure in preference to a second face.

4. A method according to claim 1 wherein the structure is exposed to a chemical reagent comprising arsenic as a group V constituent thereby to deposit arsenide group III–V material over a first face of the structure and a chemical reagent comprising phosphorous as a group V constituent thereby to deposit phosphide group III–V material over a first and a second face of the structure.

5. A method according to claim 1 wherein the first faces are orientated substantially parallel to the (100) crystallographic plane and the second faces are orientated substantially parallel to the (111) A plane thereby to define a mesa or a trough structure in the semiconductor substrate.

6. A method according to claim 5 wherein the first faces are orientated at an offset of up to 5° relative to the (100) crystallographic plane.

7. A method according to claim 3 wherein the structure comprises a mesa structure and wherein exposure of the mesa to the chemical reagent comprising arsenic is arranged to provide a layer of arsenic group III–V material over a first face of the mesa structure and substrate, the layer having a thickness such that the length of the surface of the layer is substantially less than the length of the first face of the mesa structure.

8. A method according to claim 1 wherein the substrate is defined using an edge aligned mask and an anisotropic etchant.

9. A method according to claim 8 wherein the mask comprises one or more oxide stripes aligned with edges extending in the (011) or (01$\bar{1}$) directions.

10. A method according to claim 8 wherein the anisotropic etchant comprises a bromine based etchant.

11. A method according to claim 9 wherein the oxide stripes have a width in the range of 3 to 6 microns.

12. A method according to claim 5 wherein the mesa/trough of the defined structure has a depth of between 2 and 3 microns.

13. A method according to claim 1 wherein the vapour phase chemical reagents comprise a mixture of metal-organic reagent species or a mixture of metal organic and hydride or halide reagent species.

* * * * *